(12) United States Patent
Bang et al.

(10) Patent No.: US 11,482,589 B2
(45) Date of Patent: Oct. 25, 2022

(54) DISPLAY APPARATUS

(71) Applicant: Samsung Display Co., Ltd., Yongin-si (KR)

(72) Inventors: Kiho Bang, Yongin-si (KR); Eunhye Kim, Yongin-si (KR); Youngwoo Park, Yongin-si (KR); Yonghwan Park, Yongin-si (KR); Saebom Ahn, Yongin-si (KR); Seongjun Lee, Yongin-si (KR); Sanghyun Jun, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 145 days.

(21) Appl. No.: 17/012,538

(22) Filed: Sep. 4, 2020

(65) Prior Publication Data

US 2021/0134928 A1    May 6, 2021

(30) Foreign Application Priority Data

Oct. 30, 2019  (KR) .................... 10-2019-0136897

(51) Int. Cl.
*H01L 27/32* (2006.01)
*H01L 51/52* (2006.01)

(52) U.S. Cl.
CPC ........ *H01L 27/3276* (2013.01); *H01L 27/326* (2013.01); *H01L 27/3246* (2013.01); *H01L 51/5253* (2013.01)

(58) Field of Classification Search
CPC . H01L 27/327; H01L 27/3246; H01L 27/326; H01L 27/3258; H01L 51/5253; H01L 51/5246
See application file for complete search history.

(56) References Cited

U.S. PATENT DOCUMENTS

| 9,196,865 B2 | 11/2015 | Kwak et al. |
| 10,186,191 B2 | 1/2019 | Kang et al. |
| 10,304,913 B2 | 5/2019 | Choi et al. |
| 2017/0345847 A1* | 11/2017 | Kim .................... H01L 27/3244 |

(Continued)

FOREIGN PATENT DOCUMENTS

| KR | 10-2015-0081728 | 7/2015 |
| KR | 10-2017-0065059 | 6/2017 |

(Continued)

*Primary Examiner* — Vongsavanh Sengdara
(74) *Attorney, Agent, or Firm* — Kile Park Reed & Houtteman PLLC

(57) ABSTRACT

A display apparatus includes a first power supply voltage line in a non-display area and including a first conductive layer, a first organic layer on the first conductive layer, and a second conductive layer on the first organic layer, a second power supply voltage line in the non-display area and including a third conductive layer spaced apart from the first conductive layer, and a fourth conductive layer on the first organic layer which is on the third conductive layer, a first dam portion adjacent to the first power supply voltage line, a second dam portion adjacent to the first dam portion, and a third dam portion between the first power supply voltage line and the first dam portion. The fourth conductive layer includes an opening exposing an upper surface of the first organic layer between the first power supply voltage line and the second dam portion.

18 Claims, 13 Drawing Sheets

(56) References Cited

U.S. PATENT DOCUMENTS

| | | | | |
|---|---|---|---|---|
| 2017/0345881 A1* | 11/2017 | Kim | ................... | H01L 51/5271 |
| 2017/0365814 A1* | 12/2017 | Kim | ................... | H01L 27/3276 |
| 2018/0033832 A1* | 2/2018 | Park | ................... | H01L 51/0023 |
| 2019/0006442 A1* | 1/2019 | Byun | ................... | H01L 27/3246 |
| 2019/0019966 A1* | 1/2019 | Jiang | ................... | H01L 51/5253 |
| 2019/0288234 A1* | 9/2019 | Kim | ................... | H01L 27/3276 |
| 2019/0296099 A1* | 9/2019 | Lee | ................... | H01L 27/3258 |
| 2020/0168685 A1 | 5/2020 | Bang et al. | | |
| 2020/0203653 A1* | 6/2020 | Um | ................... | H01L 27/3276 |

FOREIGN PATENT DOCUMENTS

| | | |
|---|---|---|
| KR | 10-2017-0066767 | 6/2017 |
| KR | 10-2020-0062445 | 6/2020 |

\* cited by examiner

DISPLAY APPARATUS

CROSS-REFERENCE TO RELATED APPLICATIONS

This application claims priority to and benefits of Korean Patent Application No. 10-2019-0136897 under 35 U.S.C. § 119, filed on Oct. 30, 2019, in the Korean Intellectual Property Office, the entire contents of which are incorporated herein by reference.

BACKGROUND

1. Technical Field

One or more embodiments relate to a display apparatus.

2. Description of Related Art

Display apparatuses are apparatuses for visually displaying data. Recently, display apparatuses have become diversified in terms of their applicability to various uses. As display apparatuses become slimmer and lighter in weight, the display apparatuses are more widely used.

Such display apparatuses may include a substrate divided into a display area and a non-display area outside the display area. The non-display area, in which non-display elements such as a pad portion, wirings, and a driving circuit may be arranged, is a dead space in which no image may be implemented. There is thus becoming an increasing need to further reduce the dead space of a display apparatus.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

One or more embodiments are provided to prevent pixel defects from occurring due to gas discharged from an organic layer arranged or disposed between two layers when a power supply line is applied in a two-layer structure to reduce a dead space. However, this is merely an example, and the scope of the disclosure is not limited thereby.

Additional aspects will be set forth in part in the description which follows and, in part, will be apparent from the description, or may be learned by practice of the presented embodiments of the disclosure.

According to one or more embodiments, a display apparatus may include a substrate, a display area including a plurality of pixels disposed on the substrate, a non-display area adjacent to the display area, a first power supply voltage line disposed in the non-display area and including a first conductive layer, a first organic layer disposed on the first conductive layer, and a second conductive layer disposed on the first organic layer, a second power supply voltage line disposed in the non-display area and including a third conductive layer spaced apart from the first conductive layer and a fourth conductive layer disposed on the first organic layer, wherein the first organic layer may be disposed on the third conductive layer; a first dam portion surrounding the display area and disposed adjacent to the first power supply voltage line, a second dam portion disposed adjacent to the first dam portion, and a third dam portion disposed between the first power supply voltage line and the first dam portion, wherein the fourth conductive layer includes an opening exposing an upper surface of the first organic layer between the first power supply voltage line and the second dam portion.

The display apparatus may further include a second organic layer disposed on the first organic layer, and a pixel defining layer disposed on the second organic layer, wherein the first dam portion may include: a first layer including a part of the second organic layer; and a second layer including a part of the pixel defining layer, the second dam portion may include: a first layer including a part of the second organic layer; and a second layer including a part of the pixel defining layer, and the third dam portion may include: a first layer including a part of the second organic layer; and a second layer including a part of the pixel defining layer.

The fourth conductive layer may include an opening disposed between the third dam portion and the second dam portion in an extending direction of the third dam portion and the second dam portion.

The opening may be disposed to overlap the first dam portion.

The fourth conductive layer may include a first portion and a second portion spaced apart from each other by the opening, the third dam portion may overlap an end of the first portion adjacent to the opening, and the second dam portion may overlap an end of the second portion adjacent to the opening.

The second dam portion may overlap an end of the second portion at a predetermined distance from the opening.

The fourth conductive layer may include a plurality of openings disposed between the third dam portion and the second dam portion.

The fourth conductive layer may include an opening disposed between the first power supply voltage line and the third dam portion in an extending direction of the third dam portion.

The fourth conductive layer may include a plurality of openings disposed between the first power supply voltage line and the third dam portion.

The pixel may include a first electrode, an emission layer disposed on the first electrode, and a second electrode disposed on the emission layer, the second electrode may be commonly disposed in the plurality of pixels, and the second electrode may extend toward the non-display area to overlap a part of the third dam portion.

The display apparatus may further include a spacer disposed on the pixel defining layer, wherein the second dam portion may include a third layer on the second layer including the part of the pixel defining layer, and the second dam portion and the spacer may include a same material.

A height of the second dam portion may be greater than a height of the first dam portion and a height of the third dam portion.

The third dam portion, the first dam portion, and the second dam portion may be disposed to overlap the second power supply voltage line.

The first conductive layer and the third conductive layer may include a same material, and the second conductive layer and the fourth conductive layer may include a same material.

The display apparatus may further include a thin-film encapsulation layer including: a first inorganic encapsulation layer overlapping the display area; an organic encapsulation layer on the first inorganic encapsulation layer; and a second inorganic encapsulation layer on the organic encapsulation layer, wherein the thin-film encapsulation layer may overlap the third dam portion and the first dam portion.

The first inorganic encapsulation layer and the second inorganic encapsulation layer may be in direct contact with an edge of the second dam portion.

The first conductive layer may be electrically connected to the second conductive layer through a first contact hole disposed in the first organic layer.

The third conductive layer may be electrically connected to the fourth conductive layer through a second contact hole disposed in the first organic layer.

According to one or more embodiments, a display apparatus may include: a substrate, a display area including a plurality of pixels disposed on the substrate, a non-display area adjacent to the display area, a first power supply voltage line disposed in the non-display area and including: a first conductive layer; a first organic layer disposed on the first conductive layer; and a second conductive layer disposed on the first organic layer, a second power supply voltage line disposed in the non-display area, the second power supply voltage line and the second conductive layer including a same material, a first dam portion surrounding the display area and disposed adjacent to the first power supply voltage line, a second dam portion disposed adjacent to the first dam portion, and a third dam portion disposed between the first power supply voltage line and the first dam portion, wherein the first organic layer may have a substantially concave-convex pattern including at least one opening between the first power supply voltage line and the second dam portion.

The fourth conductive layer may be disposed on the first organic layer along the substantially concave-convex pattern.

BRIEF DESCRIPTION OF THE DRAWINGS

The above and other aspects, features, and advantages of embodiments will be more apparent from the following description taken in conjunction with the accompanying drawings, in which.

DETAILED DESCRIPTION OF THE EMBODIMENTS

Figure 1:
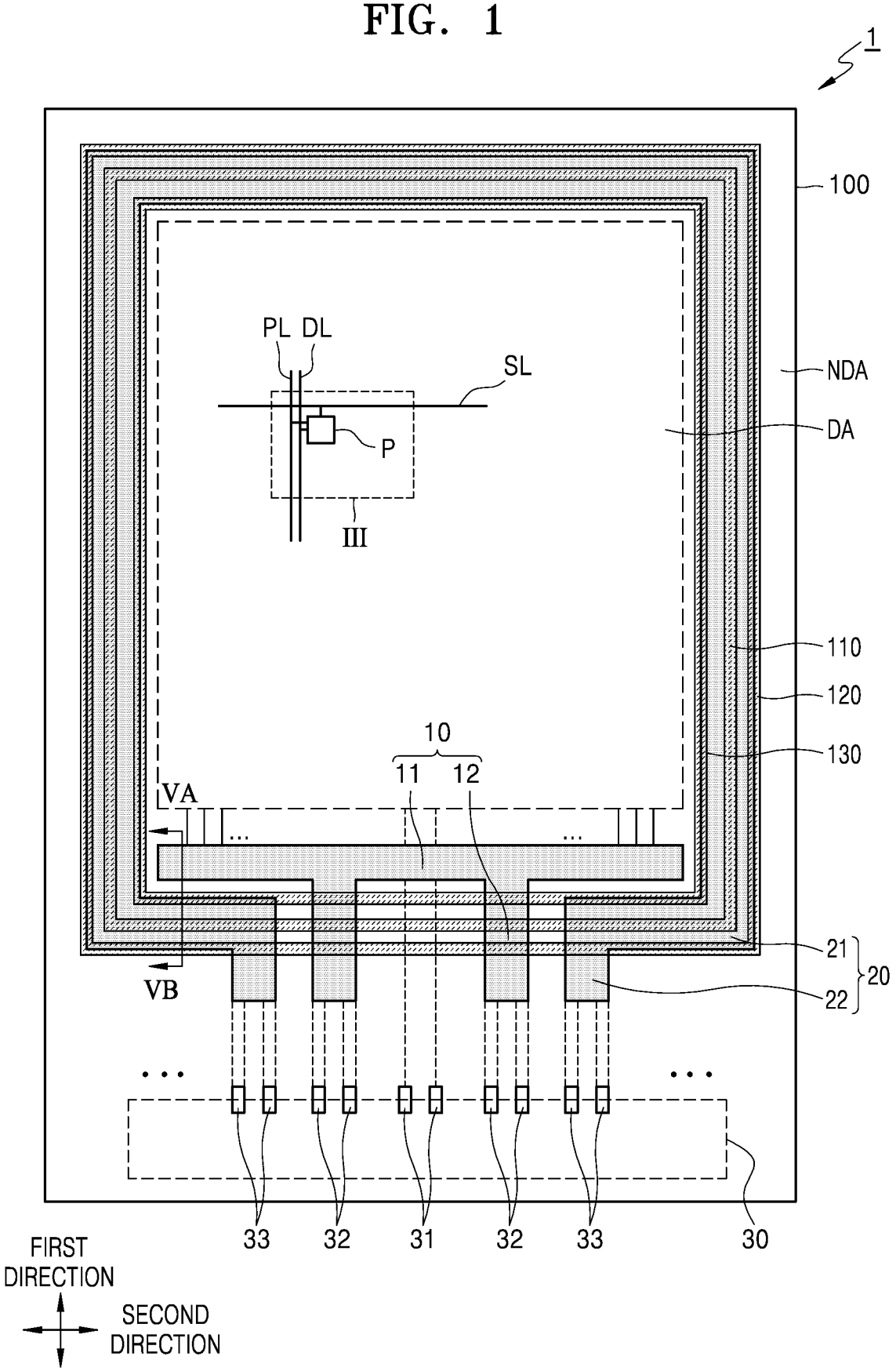
FIG. 1 is a schematic plan view of a display apparatus according to an embodiment.

Reference will now be made in detail to embodiments, examples of which are illustrated in the accompanying drawings, wherein like reference numerals refer to like elements throughout. In this regard, the embodiments may have different forms and should not be construed as being limited to the descriptions set forth herein. Accordingly, the embodiments are merely described below, by referring to the figures, to explain aspects of the description.

Hereinafter, embodiments will be described in detail with reference to the accompanying drawings. When describing embodiments with reference to the accompanying drawings, the same or corresponding elements may be denoted by the same reference numerals and a redundant description thereof will be omitted.

Some of the parts which are not associated with the description may not be provided in order to describe embodiments of the disclosure and like reference numerals refer to like elements throughout the specification.

It will be understood that although the terms "first," "second," etc. may be used herein to describe various elements, these elements should not be limited by these terms. These terms are only used to distinguish one element from another. For instance, a first element discussed below could be termed a second element without departing from the teachings of the disclosure. Similarly, the second element could also be termed the first element.

As used herein, the singular forms "a," "an," and "the" are intended to include the plural forms as well, unless the context clearly indicates otherwise.

It will be understood that terms such as "comprise," "comprises", "comprising", "include," "includes", and "including" and "have" and "having" used herein specify the presence of stated features or elements, but do not preclude the presence or addition of one or more other features or elements.

When a layer, film, region, substrate, or area, is referred to as being "on" another layer, film, region, substrate, or area, it may be directly on the other film, region, substrate, or area, or intervening films, regions, substrates, or areas, may be present therebetween. Conversely, when a layer, film, region, substrate, or area, is referred to as being "directly on" another layer, film, region, substrate, or area, intervening layers, films, regions, substrates, or areas, may be absent therebetween. Further when a layer, film, region, substrate, or area, is referred to as being "below" another layer, film, region, substrate, or area, it may be directly below the other layer, film, region, substrate, or area, or intervening layers, films, regions, substrates, or areas, may be present therebetween. Conversely, when a layer, film, region, substrate, or area, is referred to as being "directly below" another layer, film, region, substrate, or area, intervening layers, films, regions, substrates, or areas, may be absent therebetween. Further, "over" or "on" may include positioning on or below an object and does not necessarily imply a direction based upon gravity.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

Sizes of components in the drawings may be exaggerated for clarity and convenience of description. In other words, since the sizes and thicknesses of elements in the drawings may be arbitrarily illustrated for convenience of description, the following embodiments are not limited thereto.

Further, in the specification, the phrase "in a plan view" means when an object portion is viewed from above, and the phrase "in a schematic cross-sectional view" means when a schematic cross-section taken by vertically cutting an object portion is viewed from the side.

Additionally, the terms "overlap" or "overlapped" mean that a first object may be above or below or to a side of a second object, and vice versa. Additionally, the term "overlap" may include layer, stack, face or facing, extending over, covering or partly covering or any other suitable term as would be appreciated and understood by those of ordinary skill in the art. The terms "face" and "facing" mean that a first element may directly or indirectly oppose a second element. In a case in which a third element intervenes between the first and second element, the first and second element may be understood as being indirectly opposed to one another, although still facing each other. When an element is described as 'not overlapping' or 'to not overlap' another element, this may include that the elements are spaced apart from each other, offset from each other, or set aside from each other or any other suitable term as would be appreciated and understood by those of ordinary skill in the art.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or." In the specification and the claims, the phrase "at least one of" is intended to include the meaning of "at least one selected from the group of" for the purpose of its meaning and interpretation. For example, "at least one of A and B" may be understood to mean "A, B, or A and B."

When an embodiment may be implemented differently, a specific process order may be performed differently from the described order. For example, two consecutively described processes may be performed substantially at the same time or performed in an order opposite to the described order.

In the following embodiments, it will be understood that when a film, layer, region, element, or component is referred to as being "connected to" or "coupled to" another film, layer, region, element, and component, it may be directly or indirectly connected or coupled to the other film, layer, region, element, or component. That is, for example, intervening films, regions, or components may be present. In the following embodiments, it will be understood that when a film, layer, region, element, or component is referred to as being "electrically connected to" or "electrically coupled to" another film, layer, region, element, and component, it may be directly or indirectly electrically connected or coupled to the other film, layer, region, element, or component. That is, for example, intervening films, layers, regions, elements, or components may be present.

Unless otherwise defined, all terms (including technical and scientific terms) used herein have the same meaning as commonly understood by one of ordinary skill in the art to which embodiments pertain. In addition, it will be further understood that terms, such as those defined in commonly-used dictionaries, should be interpreted as having a meaning that is consistent with their meaning in the context of the relevant art and will not be interpreted in an idealized or overly formal sense unless expressly so defined herein.

A display apparatus may be an apparatus for displaying an image or images and may be a liquid crystal display, an electrophoretic display, an organic light-emitting display, an inorganic light-emitting display, a field emission display, a surface-conduction electron-emitter display, a plasma display, a cathode ray display, or other display within the spirit and the scope of the disclosure.

Although an organic light-emitting display apparatus will be described below as an example of a display apparatus according to an embodiment, the display apparatus according to an embodiment is not limited thereto. Various types of display apparatuses may be used within the spirit and the scope of the disclosure.

Figure 2A:
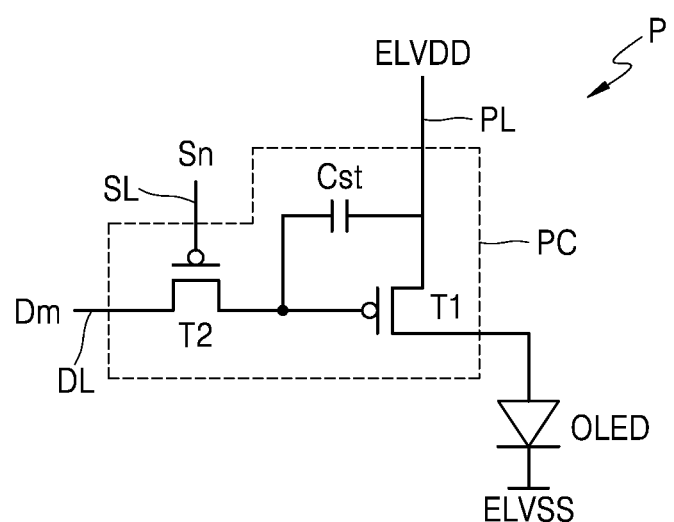
FIGS. 2A and 2B are equivalent circuit diagrams of a pixel included in the display apparatus, according to an embodiment.
Figure 2B:
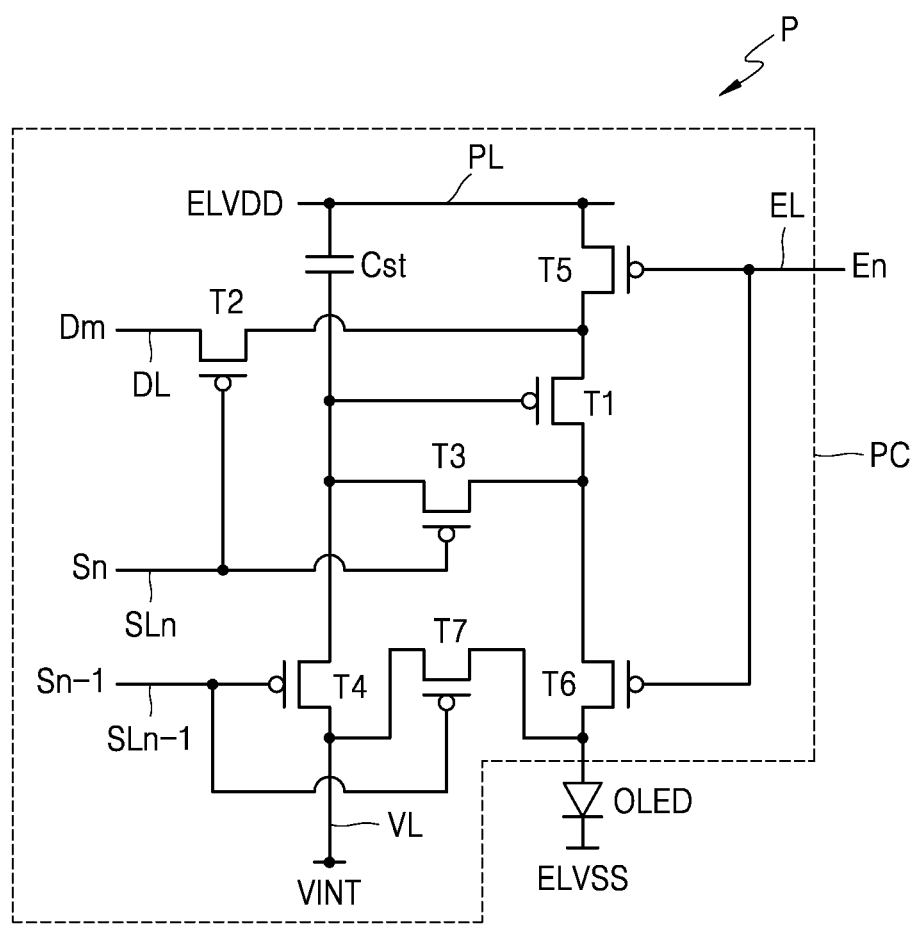
Figure 3:
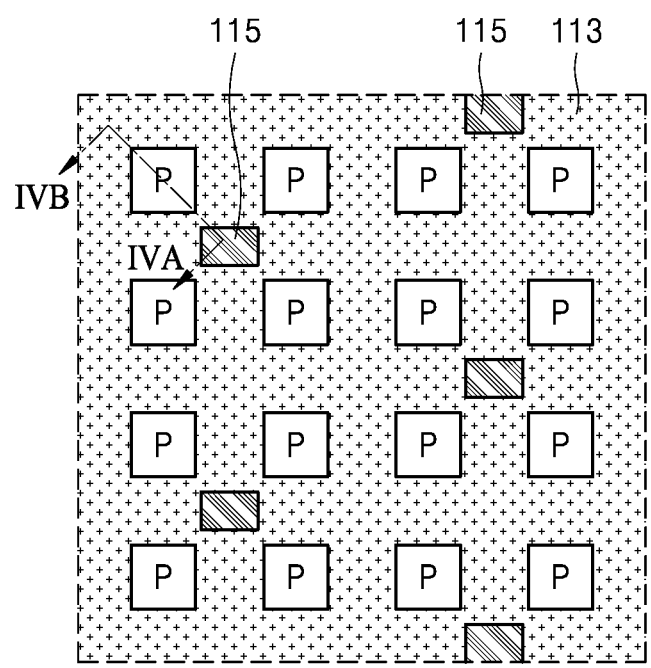
FIG. 3 is a schematic plan view of a region III of FIG. 1.
Figure 4:
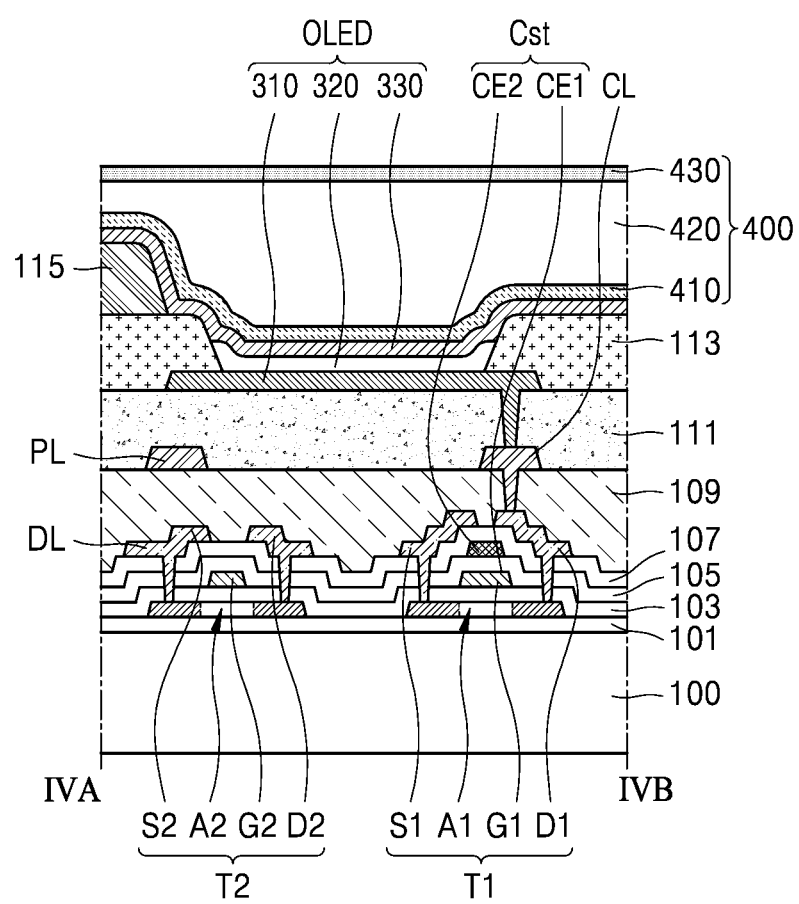
FIG. 4 is a schematic cross-sectional view taken along line IVA-IVB of FIG. 3, which illustrates a pixel included in the display apparatus of FIG. 1.
Figure 5:
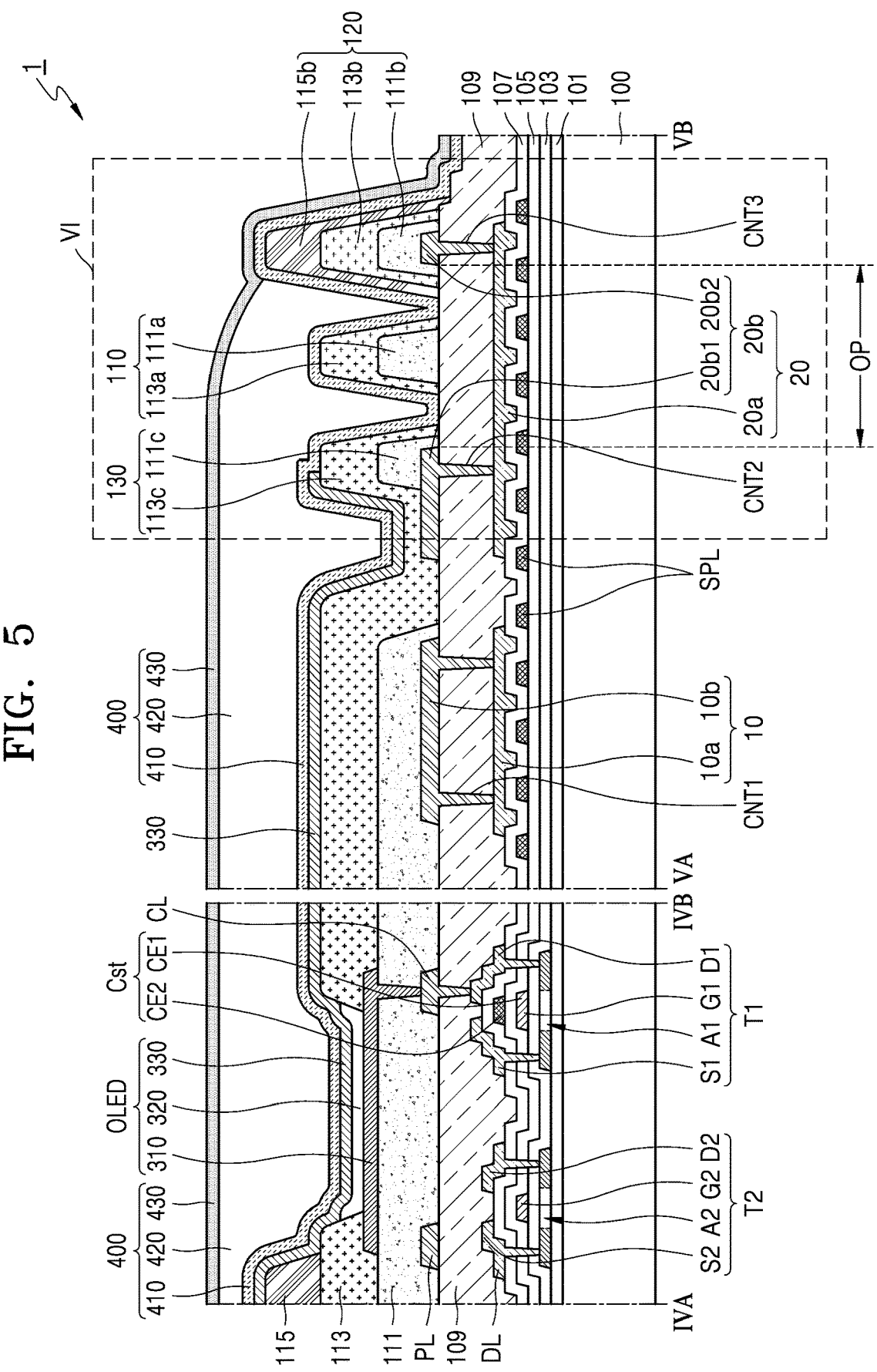
FIG. 5 is a schematic cross-sectional view of the display apparatus taken along line VA-VB of FIG. 1.

FIG. 1 is a schematic plan view of a display apparatus 1 according to an embodiment. FIGS. 2A and 2B are equivalent circuit diagrams illustrating examples of a pixel included in the display apparatus 1, according to an embodiment. FIG. 3 is a schematic plan view of the region III of FIG. 1. FIG. 4 is a schematic cross-sectional view taken along line IVA-IVB of FIG. 3, which illustrates a pixel included in the display apparatus 1 according to an embodiment. FIG. 5 is a schematic cross-sectional view taken along line VA-VB of FIG. 1.

Referring to FIG. 1, the display apparatus 1 may include a display area DA arranged or disposed on a substrate 100. The display area DA may include pixels P electrically connected to a data line DL extending in a first direction and a scan line SL extending in a second direction. The second direction may intersect with the first direction. The pixels P may each be electrically connected to a driving voltage line PL extending in the first direction.

One pixel P may emit, for example, red light, green light, blue light, or white light and may include, for example, an organic light emitting diode OLED. The pixels P may each include a device such as a thin-film transistor (TFT) and a capacitor.

The display area DA may provide a certain image (or images) through light emitted from the pixels P, and a non-display area NDA may be arranged or disposed outside the display area DA. For example, the non-display area NDA may surround the display area DA.

The non-display area NDA may be an area in which the pixels P may not be arranged or disposed, and the non-display NDA area may not provide an image (or images). A first power supply voltage line 10 may be arranged or disposed in the non-display area NDA. A second power supply voltage line 20 may provide a voltage different from that of the first power supply voltage line 10 and the second power supply voltage line 20 may be arranged or disposed in the non-display area NDA.

The first power supply voltage line 10 may include a first main voltage line 11 and a first connection line 12, which may be arranged or disposed on a side of the display area DA. For example, when the display area DA is rectangular, the first main voltage line 11 may be arranged or disposed to correspond to a side of the display area DA. The first connection line 12 may extend from the first main voltage line 11 in the first direction. In an embodiment, the first direction may be understood as a direction from the display area DA toward a terminal portion 30 located or disposed near an end of the substrate 100. The first connection line 12 may be electrically connected to a first terminal 32 of the terminal portion 30.

The second power supply voltage line 20 may include a second main voltage line 21 that may partially surround both ends of the first main voltage line 11, and the display area DA, and a second connection line 22 extending from the second main voltage line 21 in the first direction. For example, when the display area DA is rectangular, the second main voltage line 21 may extend along both ends of the first main voltage line 11 and the remaining sides except for a side of the display area DA adjacent to the first main voltage line 11. The second connection line 22 may extend in the first direction substantially parallel to the first connection line 12 and may be electrically connected to a second terminal 33 of the terminal portion 30. The second power supply voltage line 20 may be bent to surround an end of the first power supply voltage line 10.

The terminal portion 30 may be arranged or disposed at an end of the substrate 100 and may include terminals 31, 32, and 33. The terminal portion 30 may be exposed without being covered with or overlapped by an insulating layer and may be electrically connected to a flexible printed circuit board or a controller (not illustrated) such as a driver IC chip.

The controller may convert image signals transmitted from the outside into image data signals and transfer the image data signals to the display area DA through a third terminal 31. The controller may receive a vertical synchronization signal, a horizontal synchronization signal, and a clock signal, generate control signals for controlling the driving of first and second gate drivers (not illustrated), and transmit the control signals through terminals (not illustrated).

The controller may transmit different voltages to the first power supply voltage line 10 and the second power supply voltage line 20 through the first terminal 32 and the second terminal 33, respectively.

The first power supply voltage line 10 may provide a first power supply voltage ELVDD (see FIGS. 2A and 2B) to each of the pixels P, and the second power supply voltage line 20 may provide a second power supply voltage ELVSS (see FIGS. 2A and 2B) to each of the pixels P.

For example, the first power supply voltage ELVDD may be provided to each of the pixels P through the driving voltage line PL electrically connected to the first power supply voltage line 10. The second power supply voltage ELVSS may be provided to a cathode of an organic light-emitting diode OLED (see FIGS. 2A and 2B) provided in each of the pixels P. In this case, the second main voltage line 21 of the second power supply voltage line 20 may be electrically connected to the cathode of the organic light-emitting diode OLED in the non-display area NDA.

Although not illustrated, a scan driver that may provide a scan signal to the scan line SL of each of the pixels P, a data driver that may provide a data signal to the data line DL, and the like may be arranged or disposed in the non-display area NDA.

In the non-display area NDA, a first dam portion 110, a second dam portion 120, and a third dam portion 130, which may surround the display area DA, may be spaced apart from each other.

When an organic encapsulation layer 420 of FIG. 4 including an organic material such as a monomer constituting a thin-film encapsulation layer 400 of FIG. 4 is formed by application of an ink-jet process, the first dam portion 110 and the second dam portion 120 may serve as a dam that may prevent the organic material from flowing toward the edge of the substrate 100 and may prevent an edge tail from being formed at the edge of the substrate 100 by the organic encapsulation layer 420.

The organic encapsulation layer 420 may flow over the first dam portion 110 and the second dam portion 120 to the edge of the substrate 100 in spite of the arrangement of the first dam portion 110 and the second dam portion 120. For example, when the position of the second dam portion 120 is arranged or disposed closer to the first dam portion 110 from the edge of the substrate 100 to reduce a dead space area recognizable at the outside, or when the position of the first dam portion 110 is arranged or disposed closer to the second dam portion 120 to expand the display area DA, an interval between the first dam portion 110 and the second dam portion 120 may be reduced, and thus, the organic encapsulation layer 420 may flow over the second dam portion 120. The edge tail formed by the overflow of the organic material may serve as an input path of external impurities, thus causing defects of the organic light-emitting diode OLED. As the dead space is reduced, the need to reduce the overflow of the organic material and control the amount of the overflowed organic material becomes more important. The third dam portion 130 arranged or disposed between the display area DA and the first dam portion 110 may reduce the amount of the organic material flowing over the first dam portion by reducing the reflow velocity of the organic material.

Referring to FIG. 2A, pixels P may each include a pixel circuit PC electrically connected to a scan line SL and a data line DL, and an organic light-emitting diode OLED electrically connected to the pixel circuit PC.

The pixel circuit PC may include a driving thin-film transistor T1, a switching thin-film transistor T2, and a storage capacitor Cst. The switching thin-film transistor T2 may transfer, to the driving thin-film transistor T1, a data signal Dm input through the data line DL according to a scan signal Sn input through the scan line SL.

The storage capacitor Cst may be electrically connected to the switching thin-film transistor T2 and a driving voltage line PL and may store a voltage corresponding to a difference between a voltage received from the switching thin-film transistor T2 and a first power supply voltage ELVDD (or a driving voltage) supplied to the driving voltage line PL.

The driving thin-film transistor T1 may be electrically connected to the driving voltage line PL and the storage capacitor Cst and may control a driving current flowing from the driving voltage line PL to the organic light-emitting diode OLED according to a voltage value stored in the storage capacitor Cst. The organic light-emitting diode OLED may emit light having a certain luminance according to the driving current.

A case in which the pixel circuit PC may include two thin-film transistors and one storage capacitor has been described with reference to FIG. 2A, but embodiments are not limited thereto.

Referring to FIG. 2B, a pixel circuit PC may include a driving thin-film transistor T1, a switching thin-film transistor T2, a compensation thin-film transistor T3, a first initialization thin-film transistor T4, a first emission control thin-film transistor T5, a second emission control thin-film transistor T6, and a second initialization thin-film transistor T7.

FIG. 2B illustrates a case in which signal lines SLn, SLn−1, EL, and DL, an initialization voltage line VL, and a driving voltage line PL may be provided for each pixel P, but embodiments are not limited thereto. In an embodiment, at least one of the signal lines SLn, SLn−1, EL, and DL, and/or the initialization voltage line VL may be shared with the adjacent pixels.

A drain electrode of the driving thin-film transistor T1 may be electrically connected to an organic light-emitting diode OLED through the second emission control thin-film transistor T6. The driving thin-film transistor T1 may receive a data signal Dm and supply a driving current to the organic light-emitting diode OLED according to a switching operation of the switching thin-film transistor T2.

A gate electrode of the switching thin-film transistor T2 may be electrically connected to the first scan line SLn, and a source electrode of the switching thin-film transistor T2 may be electrically connected to the data line DL. A drain electrode of the switching thin-film transistor T2 may be electrically connected to a source electrode of the driving thin-film transistor T1 and electrically connected to the driving voltage line PL through the first emission control thin-film transistor T5.

The switching thin-film transistor T2 may be turned on according to a first scan signal Sn received through the first scan line SLn to perform a switching operation to transfer the data signal Dm received through the data line DL to the source electrode of the driving thin-film transistor T1.

A gate electrode of the compensation thin-film transistor T3 may be electrically connected to the first scan line SLn. A source electrode of the compensation thin-film transistor T3 may be electrically connected to the drain electrode of the driving thin-film transistor T1 and electrically connected to a pixel electrode of the organic light-emitting diode OLED through the second emission control thin-film transistor T6. A drain electrode of the compensation thin-film transistor T3 may be electrically connected to any one electrode of the storage capacitor Cst, a source electrode of the first initialization thin-film transistor T4, and a gate electrode of the driving thin-film transistor T1. The compensation thin-film transistor T3 may be turned on according to the first scan signal Sn received through the first scan line SLn to electrically connect the gate electrode and the drain electrode of the driving thin-film transistor T1 to each other such that the driving thin-film transistor T1 may be diode-connected.

A gate electrode of the first initialization thin-film transistor T4 may be electrically connected to the second scan line (the second previous scan line) SLn−1. A drain electrode of the first initialization thin-film transistor T4 may be electrically connected to the initialization voltage line VL. The source electrode of the first initialization thin-film transistor T4 may be electrically connected to any one electrode of the storage capacitor Cst, the drain electrode of the compensation thin-film transistor T3, and the gate electrode of the driving thin-film transistor T1. The first initialization thin-film transistor T4 may be turned on according to a second scan signal Sn−1 received through the second scan line SLn−1 to perform an initialization operation to transfer an initialization voltage VINT to the gate electrode of the driving thin-film transistor T1 to initialize the voltage of the gate electrode of the driving thin-film transistor T1.

A gate electrode of the first emission control thin-film transistor T5 may be electrically connected to an emission control line EL. A source electrode of the first emission control thin-film transistor T5 may be electrically connected to the driving voltage line PL. A drain electrode of the first emission control thin-film transistor T5 may be electrically connected to the source electrode of the driving thin-film transistor T1 and the drain electrode of the switching thin-film transistor T2.

A gate electrode of the second emission control thin-film transistor T6 may be electrically connected to the emission control line EL. A source electrode of the second emission control thin-film transistor T6 may be electrically connected to the drain electrode of the driving thin-film transistor T1 and the source electrode of the compensation thin-film transistor T3. A drain electrode of the second emission control thin-film transistor T6 may be electrically connected to the pixel electrode of the organic light-emitting diode OLED. The first emission control thin-film transistor T5 and the second emission control thin-film transistor T6 may be simultaneously turned on according to an emission control signal En received through the emission control line EL to transfer a first power supply voltage ELVDD to the organic light-emitting diode OLED such that the driving current may flow through the organic light-emitting diode OLED.

A gate electrode of the second initialization thin-film transistor T7 may be electrically connected to the second scan line SLn−1. A source electrode of the second initialization thin-film transistor T7 may be electrically connected to the pixel electrode of the organic light-emitting diode OLED. A drain electrode of the second initialization thin-film transistor T7 may be electrically connected to the initialization voltage line VL. The second initialization thin-film transistor T7 may be turned on according to the second scan signal Sn−1 received through the second scan line SLn−1 to initialize the pixel electrode of the organic light-emitting diode OLED.

FIG. 2B illustrates a case in which the first initialization thin-film transistor T4 and the second initialization thin-film transistor T7 may be electrically connected to the second scan line SLn−1, but embodiments are not limited thereto. In an embodiment, the first initialization thin-film transistor T4 may be electrically connected to the previous scan line, for example, the second scan line SLn−1, and may be driven according to the second scan signal Sn−1, and the second initialization thin-film transistor T7 may be electrically connected to a separate signal line (for example, a next scan line) and may be driven according to a signal received through the corresponding scan line.

The other electrode of the storage capacitor Cst may be electrically connected to the driving voltage line PL. Any one electrode of the storage capacitor Cst may be electrically connected to the gate electrode of the driving thin-film transistor T1, the drain electrode of the compensation thin-film transistor T3, and the source electrode of the first initialization thin-film transistor T4.

An opposite electrode (for example, a cathode) of the organic light-emitting diode OLED may receive a second power supply voltage ELVSS (or a common power supply voltage). The organic light-emitting diode OLED may receive the driving current from the driving thin-film transistor T1 and may emit light.

The pixel circuit PC is not limited to the number and the circuit design of the thin-film transistors and the storage capacitors described above with reference to FIGS. 2A and 2B, and the number and the circuit design of the thin-film transistors and the storage capacitors may be variously changed within the spirit and the scope of the disclosure.

The region III of FIG. 1 and the first (driving thin-film transistor) and second (switching thin-film transistor) thin-film transistors T1 and T2 and the storage capacitor Cst in the pixel circuit PC of each pixel P described above with reference to FIGS. 2A and 2B will be described in more detail with reference to FIGS. 3 and 4.

Referring to FIG. 3, pixels P may be arranged or disposed in the region III of FIG. 1. The pixels P may be surrounded by a pixel defining layer 113, and spacers 115 may be arranged or disposed on the pixel defining layer 113.

The pixels P are illustrated in FIG. 3 as a substantially rectangular shape having substantially the same size, but this is merely an example. The pixels P may have different sizes and different shapes.

The spacers 115 may be arranged or disposed between some (or a predetermined number of) pixels P among the pixels P. In the process of depositing an intermediate layer 320 including an emission layer by application of a mask, the spacers 115 may maintain a spacing between the mask and the substrate 100 to prevent the intermediate layer 320 from being perforated or otherwise damaged in the deposition process.

The spacers 115 may include the same or similar material as that of the pixel defining layer 113. When the pixel defining layer 113 is formed by application of a halftone mask, the spacers 115 may be formed of the same or similar material as that of the pixel defining layer 113 at a height different from that of the pixel defining layer 113.

Referring to FIG. 4, a buffer layer 101 may be arranged or disposed on the substrate 100, and a driving thin-film transistor T1, a switching thin-film transistor T2, and a storage capacitor Cst may be arranged or disposed on the buffer layer 101.

The substrate 100 may include various materials, such as glass, metal, or plastics. For example, the substrate 100 may be a flexible substrate including a polymer resin, such as polyethersulphone (PES), polyacrylate (PA), polyetherimide (PEI), polyethylene naphthalate (PEN), polyethylene terephthalate (PET), polyphenylene sulfide (PPS), polyarylate (PAR), polyimide (PI), polycarbonate (PC), or cellulose acetate propionate (CAP).

A buffer layer 101 formed of silicon oxide ($SiO_x$) and/or silicon nitride ($SiN_x$) may be provided or disposed on the substrate 100 and may prevent penetration of impurities.

The driving thin-film transistor T1 may include a driving semiconductor layer A1 and a driving gate electrode G1, and the switching thin-film transistor T2 may include a switching semiconductor layer A2 and a switching gate electrode G2. A first gate insulating layer 103 may be arranged or disposed between the driving semiconductor layer A1 and the driving gate electrode G1 and between the switching semiconductor layer A2 and the switching gate electrode G2. The first gate insulating layer 103 may include an inorganic insulating material such as silicon oxide ($SiO_x$), silicon nitride ($SiN_x$), or silicon oxynitride (SiON).

The driving semiconductor layer A1 and the switching semiconductor layer A2 may include amorphous silicon or polycrystalline silicon. In an embodiment, the driving semiconductor layer A1 and the switching semiconductor layer A2 may each include an oxide of at least one selected from indium (In), gallium (Ga), stannum (Sn), zirconium (Zr), vanadium (V), hafnium (Hf), cadmium (Cd), germanium (Ge), chromium (Cr), titanium (Ti), and zinc (Zn).

The driving semiconductor layer A1 may include a driving channel region overlapping the driving gate electrode G1 and not doped with impurities, and a driving source region and a driving drain region arranged or disposed on both sides of the driving channel region and doped with impurities. A driving source electrode S1 and a driving drain electrode D1 may be electrically connected to the driving source region and the driving drain region, respectively.

The switching semiconductor layer A2 may include a switching channel region overlapping the switching gate electrode G2 and not doped with impurities, and a switching source region and a switching drain region arranged or disposed on both sides of the switching channel region and doped with impurities. A switching source electrode S2 and a switching drain electrode D2 may be electrically connected to the switching source region and the switching drain region, respectively.

The driving gate electrode G1 and the switching gate electrode G2 may each include molybdenum (Mo), aluminum (Al), copper (Cu), titanium (Ti), or the like and may be a single layer or a multi-layer.

In one or more embodiments, the storage capacitor Cst may be arranged or disposed to overlap the driving thin-film transistor T1. In this case, the areas of the storage capacitor Cst and the driving thin-film transistor T1 may be increased and high quality images may be provided. For example, the driving gate electrode G1 may be a first storage capacitor plate CE1 of the storage capacitor Cst. A second storage capacitor plate CE2 may overlap the first storage capacitor plate CE1, with a second gate insulating layer 105 between the first storage capacitor plate CE1 and the second storage capacitor plate CE2. The second gate insulating layer 105 may include an inorganic insulating material such as silicon oxide ($SiO_x$), silicon nitride ($SiN_x$), or silicon oxynitride (SiON).

The driving thin-film transistor T1, the switching thin-film transistor T2, and the storage capacitor Cst may be covered with or overlapped by an interlayer insulating layer 107.

The interlayer insulating layer 107 may be an inorganic layer such as silicon oxynitride (SiON), silicon oxide ($SiO_x$), and/or silicon nitride ($SiN_x$).

The data line DL may be arranged or disposed on the interlayer insulating layer 107. The data line DL may be electrically connected to the switching semiconductor layer A2 of the switching thin-film transistor T2 through a contact hole penetrating through the interlayer insulating layer 107. The data line DL may serve as the switching source electrode S2.

The driving source electrode S1, the driving drain electrode D1, the switching source electrode S2, and the switching drain electrode D2 may be arranged or disposed on the interlayer insulating layer 107 and may be electrically connected to the driving semiconductor layer A1 or the switching semiconductor layer A2 through the contact hole penetrating through the interlayer insulating layer 107.

The data line DL, the driving source electrode S1, the driving drain electrode D1, the switching source electrode S2, and the switching drain electrode D2 may be covered with or overlapped by an inorganic protective layer (not illustrated).

The inorganic protective layer (not illustrated) may be a single-layered film or a multi-layered film of silicon nitride ($SiN_x$) and silicon oxide ($SiO_x$). The inorganic protective layer (not illustrated) may prevent some lines exposed in the non-display area NDA from being damaged by an etchant used during patterning of the pixel electrode 310. The lines exposed in the non-display area NDA may be, for example, lines formed with the data line DL in a same process.

The driving voltage line PL may be arranged or disposed on a different layer than the data line DL. As used herein, the expression "A and B are arranged or disposed on different layers" may refer to a case in which at least one insulating layer may be arranged or disposed between A and B so that one of A and B may be arranged or disposed under the at least one insulating layer and the other thereof may be arranged or disposed above the at least one insulating layer. A first organic layer 109 may be arranged or disposed between the driving voltage line PL and the data line DL, and the driving voltage line PL may be covered with or overlapped by a second organic layer 111.

The driving voltage line PL may be a single-layered film or a multi-layered film including at least one of aluminum (Al), copper (Cu), titanium (Ti), and any alloy thereof. In an embodiment, the driving voltage line PL may be a three-layer layer of Ti/Al/Ti.

A configuration in which the driving voltage line PL may be arranged or disposed on the first organic layer 109 is illustrated in FIG. 4, but embodiments are not limited thereto. In an embodiment, the driving voltage line PL may be electrically connected to a lower additional voltage line (not illustrated), which may be formed or disposed on the same layer as that of the data line DL, through a through hole (not illustrated), which may be formed in the first organic layer 109, thereby reducing resistance.

The first organic layer 109 and the second organic layer 111 may each be a single-layered film or a multi-layered film.

The first organic layer 109 and the second organic layer 111 may each include an organic insulating material. For example, the organic insulating material may include a general-purpose polymer (imide-based polymer, polymethylmethacrylate (PMMA), or polystyrene (PS)), a polymer derivative having a phenol-based group, an acryl-based polymer, an arylether-based polymer, an amide-based polymer, a fluorine-based polymer, a p-xylene-based polymer, a vinylalcohol-based polymer, and other materials within the spirit and the scope of the disclosure.

An organic light-emitting diode OLED including a pixel electrode 310, an opposite electrode 330, and an intermediate layer 320 arranged or disposed therebetween and including an emission layer may be located or disposed on the second organic layer 111.

The pixel electrode 310 may be electrically connected to a connection line CL formed or disposed on the first organic layer 109, and the connection line CL may be electrically connected to the driving drain electrode D1 of the driving thin-film transistor T1.

The pixel electrode 310 may be a transparent electrode or a reflective electrode.

When the pixel electrode 310 is a transparent electrode, the pixel electrode 310 may include a transparent conductive layer. The transparent conductive layer may include at least one selected from indium tin oxide (ITO), indium zinc oxide (IZO), zinc oxide (ZnO), indium oxide ($In_2O_3$), indium gallium oxide (IGO), and aluminium zinc oxide (AZO). As an example further to the transparent conductive layer, the pixel electrode 310 may include a semi-transmissive layer to improve light efficiency. The semi-transmissive layer may be a thin-film having a thickness in a range of several micrometers (μm) to tens of micrometers (μm) and may include at least one selected from Ag, Mg, Al, Pt, Pd, Au, Ni, Nd, Ir, Cr, Li, Ca, and Yb.

When the pixel electrode 310 is a reflective electrode, the pixel electrode 310 may include a reflective layer and a transparent conductive layer arranged or disposed above and/or below the reflective film. The reflective layer may include one selected from Ag, Mg, Al, Pt, Pd, Au, Ni, Nd, Ir, Cr, and any compound thereof. The transparent conductive layer may include at least one selected from ITO, IZO, ZnO, $In_2O_3$, IGO, and AZO.

However, embodiments are not limited thereto. The pixel electrode 310 may include various materials and may be variously modified. For example, the pixel electrode 310 may have a single-layered structure or a multi-layered structure.

A pixel defining layer 113 may be arranged or disposed on the pixel electrode 310.

The pixel defining layer 113 may have an opening exposing the pixel electrode 310 to define the pixel P. The pixel defining layer 113 may increase a distance between an edge of the pixel electrode 310 and the opposite electrode 330, thereby preventing arcs or the like from occurring at an end of the pixel electrode. The pixel defining layer 113 may include, for example, an organic material such as polyimide or hexamethyldisiloxane (HMDSO).

The intermediate layer 320 may include a low-molecular-weight material or a high-molecular-weight material.

When the intermediate layer 320 includes a low-molecular-weight material, the intermediate layer 320 may have a structure in which a hole injection layer, a hole transport layer, an emission layer, an electron transport layer, and an electron injection layer may be stacked in a single-layered structure or a multi-layered structure. The intermediate layer 320 may include various organic materials such as copper phthalocyanine (CuPc), N—N'-di(naphthalene-1-yl)-N,N'-diphenyl-benzidine (NPB), and tris-8-hydroxyquinoline aluminum (Alq3). The intermediate layer 320 may be formed by various methods such as vacuum deposition. However, the disclosure is not limited thereto.

When the intermediate layer 320 includes a high-molecular-weight material, the intermediate layer 320 may have a structure including a hole transport layer and an emission layer. In this case, the hole transport layer may include poly(3,4-ethylenedioxythiophene (PEDOT), and the emission layer may include a high-molecular-weight material such as a poly-phenylenevinylene (PPV)-based polymer and a polyfluorene-based polymer. The intermediate layer 320 may be formed by various methods, for example, such as screen printing, inkjet printing, or laser induced thermal image.

The intermediate layer 320 may be an integrated layer over the pixel electrodes 310, or may be layers patterned corresponding to the respective pixel electrodes 310.

The opposite electrode 330 may be arranged or disposed above the display area DA and may be arranged or disposed to cover or overlap the display area DA. For example, the opposite electrode 330 may be integrally formed in the organic light-emitting diodes OLED and correspond to the pixel electrodes 310. The opposite electrode 330 may be electrically connected to a second power supply voltage line 20 to be described below.

The opposite electrode 330 may be a transparent electrode or a reflective electrode. When the opposite electrode 330 is a transparent electrode, the opposite electrode 330 may include one or more selected from Ag, Al, Mg, Li, Ca, Cu, LiF/Ca, LiF/Al, MgAg, and CaAg. The opposite electrode 330 may be a thin-film having a thickness in a range of several nanometers (nm) to tens of nanometers (nm).

When the opposite electrode 330 is a reflective electrode, the opposite electrode 330 may include at least one selected from Ag, Al, Mg, Li, Ca, Cu, LiF/Ca, LiF/Al, MgAg, and CaAg. The structure and material of the opposite electrode 330 are not limited thereto, and various modifications may be made thereto.

A spacer 115 may be arranged or disposed on the pixel defining layer 113. The spacer 115 may protrude from the pixel defining layer 113 toward the thin-film encapsulation layer 400. In the process of depositing the intermediate layer 320 including the emission layer by application of a mask, the spacer 115 may maintain a spacing between the mask and the substrate 100 to prevent the intermediate layer 320 from being perforated or otherwise damaged in the deposition process.

The spacer 115 may include an organic material such as polyimide or hexamethyldisiloxane (HMDSO). The spacer 115 may be arranged or disposed on at least one of first to third dam portions 110, 120, and 130 to be described later and may prevent moisture permeation and form a height difference in the dam portions.

Since the organic light-emitting diode OLED may be easily damaged by external moisture or oxygen, the organic light-emitting diode OLED may be covered or overlapped and protected by the thin-film encapsulation layer 400.

The thin-film encapsulation layer 400 may cover or overlap the display area DA and extend to the outside of the display area DA. The thin-film encapsulation layer 400 may include at least one organic encapsulation layer and at least one inorganic encapsulation layer. In an embodiment, the thin-film encapsulation layer 400 may include a first inorganic encapsulation layer 410, an organic encapsulation layer 420, and a second inorganic encapsulation layer 430.

The first inorganic encapsulation layer 410 may cover or overlap the entire opposite electrode 330 and include silicon oxide, silicon nitride, and/or silicon oxynitride.

Other layers such as a capping layer (not illustrated) may be arranged or disposed between the first inorganic encapsulation layer 410 and the opposite electrode 330. For example, the capping layer (not illustrated) may include one or more organic materials or inorganic materials selected from silicon oxide ($SiO_2$), silicon nitride ($SiN_x$), zinc oxide ($ZnO_2$), titanium oxide ($TiO_2$), zirconium oxide ($ZrO_2$), indium tin oxide (ITO) indium zinc oxide (IZO), Alq3, CuPc, CBP, a-NPB, $ZiO_2$ to improve light efficiency. In an embodiment, the capping layer (not illustrated) may cause plasmon resonance with respect to light generated by the organic light-emitting diode OLED. For example, the capping layer (not illustrated) may include nanoparticles. The capping layer (not illustrated) may prevent the organic light-emitting diode OLED from being damaged by heat, plasma, or the like generated in a chemical vapor deposition process or a sputtering process for forming the thin-film encapsulation layer 400. For example, the capping layer (not illustrated) may include at least one epoxy-based material selected from a bisphenol epoxy resin, an epoxidized butadiene resin, a fluorine epoxy resin, and a novolac epoxy resin.

A layer (not illustrated) including LiF may be arranged or disposed between the first inorganic encapsulation layer 410 and the capping layer (not illustrated).

Since the first inorganic encapsulation layer 410 may be formed or disposed along the underlying structure, an upper surface of the first inorganic encapsulation layer 410 may not be flat. The organic encapsulation layer 420 may cover or overlap the first inorganic encapsulation layer 410 to achieve planarization. The organic encapsulation layer 420 may have a substantially flat upper surface in a portion corresponding to the display area DA.

The organic encapsulation layer 420 may include polyethylene terephthalate, polyethylene naphthalate, polycarbonate, polyimide, polyethylene sulfonate, polyoxymethylene, polyarylate, hexamethyldisiloxane, acrylic resin (for example, polymethylmethacrylate, polyacrylic acid, or the like), or any combination thereof.

The second inorganic encapsulation layer 430 may cover or overlap the organic encapsulation layer 420 and include silicon oxide, silicon nitride, and/or silicon oxynitride. Although not shown, a second inorganic layer 145 may be arranged or disposed to be in direct contact with a first inorganic layer 141 at an edge region of the display apparatus 1, thereby preventing an organic layer 143 from being exposed to the outside of the display apparatus 1.

The left side of FIG. 5 illustrates the structure of the pixel P of FIG. 4, and the right side of FIG. 5 illustrates a schematic cross-section taken along VA-VB of FIG. 1.

The buffer layer 101, the first gate insulating layer 103, the second gate insulating layer 105, the interlayer insulating layer 107, and the first organic layer 109, which may extend on the substrate 100 in the display area DA, may be arranged or disposed in the VA-VB region. Spider lines SPL may be arranged or disposed between the second gate insulating layer 105 and the interlayer insulating layer 107, a first conductive layer 10a and a third conductive layer 20a may be arranged or disposed on the interlayer insulating layer 107, and a second conductive layer 10b and a fourth conductive layer 20b may be arranged or disposed on the first organic layer 109.

The first conductive layer 10a and the second conductive layer 10b may be electrically connected through first contact holes CNT1 formed in the interlayer insulating layer 107 to constitute the first power supply voltage line 10 that may provide the first power supply voltage ELVDD (see FIGS. 2A and 2B) to each pixel P. Since the first power supply voltage line 10 may be formed as a two-layer conductive layer, a width of the first power supply voltage line 10 may be reduced, thereby reducing a dead space. Two first contact holes CNT1 may be illustrated in FIG. 5, but this is an example. The number of first contact holes CNT1 may be one or three or more within the spirit and the scope of the disclosure.

The third conductive layer 20a and the fourth conductive layer 20b may be electrically connected through a second contact hole CNT2 and a third contact hole CNT3 formed in the interlayer insulating layer 107, respectively, to constitute the second power supply voltage line 20 that may provide the second power supply voltage ELVSS (see FIGS. 2A and 2B) to each pixel P.

In an embodiment, the fourth conductive layer 20b may include an opening OP exposing an upper surface of the first organic layer 109. Since the second power supply voltage line 20 may be formed as a two-layer conductive layer of the third conductive layer 20a and the fourth conductive layer 20b, a width of the second power supply voltage line 20 may be reduced, thereby reducing a dead space. However, when the fourth conductive layer 20b blocks the upper portion of the first organic layer 109, out-gas emitted from the first organic layer 109 may remain in the organic light-emitting diode OLED in the process of forming the organic light-emitting diode OLED. This may result in damage to the organic light-emitting diode OLED. However, in an embodiment, the opening OP may be formed in the fourth conductive layer 20b to expose an upper surface of the first organic layer 109, thereby facilitating the discharge of out-gas emitted from the first organic layer 109 during the process of manufacturing the organic light-emitting diode OLED.

Regarding the fourth conductive layer 20b, a first portion 20b1 close to the display area DA (see FIG. 1) and a second portion 20b2 far from the display area DA based on the opening OP will be described below. The first portion 20b1 of the fourth conductive layer 20b may be electrically connected to the third conductive layer 20a through the second contact hole CNT2, and the second portion 20b2 of the fourth conductive layer 20b may be electrically connected to the third conductive layer 20a through the third contact hole CNT3. In FIG. 5, one second contact hole CNT2 and one third contact hole CNT3 are illustrated, but this is an example. The number of second contact holes CNT2 and the number of third contact holes CNT3 may be one or more in keeping with the spirit and the scope of the disclosure.

The first conductive layer 10a and the third conductive layer 20a may be formed of the same or similar material as that of the data line DL, and the second conductive layer 10b and the fourth conductive layer 20b may be formed of the same or similar material as that of the driving voltage line PL.

The second organic layer 111 and the pixel defining layer 113 may be respectively located or disposed on the second conductive layer 10b at a position overlapping the first power supply voltage line 10. The opposite electrode 330 formed or disposed in the display area DA may extend on the pixel defining layer 113.

The third dam portion 130, the first dam portion 110, and the second dam portion 120 may be sequentially arranged or disposed at a position overlapping the second power supply voltage line 20 in a direction from the display area DA to the end of the substrate 100.

The third dam portion 130 may include a first layer 111c formed of the same or similar material as the second organic layer 111, and a second layer 113c formed of the same or similar material as the pixel defining layer 113. The second layer 113c of the third dam portion 130 may clad an upper surface and a side surface of the first layer 111c to stably secure a process margin during patterning of the second layer 113c in a photolithography process, thereby stably securing a height of the second layer 113c.

A part of the third dam portion 130 may overlap the opposite electrode 330 extending in the display area DA. The end of the opposite electrode 330 may extend to the second power supply voltage line 20, thereby blocking noises caused by lines that may affect a touch sensing layer (not illustrated) formed or disposed on the thin-film encapsulation layer 400.

The first dam portion 110 may include a first layer 111a formed of the same or similar material as that of the second organic layer 111 and a second layer 113a may be formed of the same or similar material as that of the pixel defining layer 113. The second layer 113a of the first dam portion 110 may clad an upper surface and a side surface of the first layer 111a to stably secure a process margin during patterning of the second layer 113a in a photolithography process, thereby stably securing a height of the second layer 113a.

The second dam portion 120 may include a first layer 111b formed of the same or similar material as that of the second organic layer 111, a second layer 113b formed of the same or similar material as that of the pixel defining layer 113, and a third layer 115b formed of the same or similar material as that of the spacer 115. The second layer 113b of the second dam portion 120 may clad an upper surface and a side surface of the first layer 111b to stably secure a process margin during patterning of the second layer 113b in a photolithography process, thereby stably securing a height of the second layer 113b.

FIG. 5 illustrates a structure in which the third layer 115b of the second dam portion 120 may clad an upper surface and a side surface of the second layer 113b, but embodiments are not limited thereto. Since it may be possible to form the second layer 113b and the third layer 115b of the second dam portion 120 by a process applying the same mask, a width of an upper surface of the second layer 113b and a width of a lower surface of the third layer 115b may be formed to be substantially identical to each other.

Since a height of the second dam portion 120 may be formed to be greater than heights of the first dam portion 110 and the third dam portion 130, it may be possible to prevent the organic encapsulation layer 420 from forming an edge tail beyond the second dam portion 120. In the process of depositing the intermediate layer 320 by application of a mask, the spacing between the mask and the substrate 100 may be maintained to prevent the intermediate layer 320 from being perforated or otherwise damaged by the mask in the deposition process.

Figure 6:
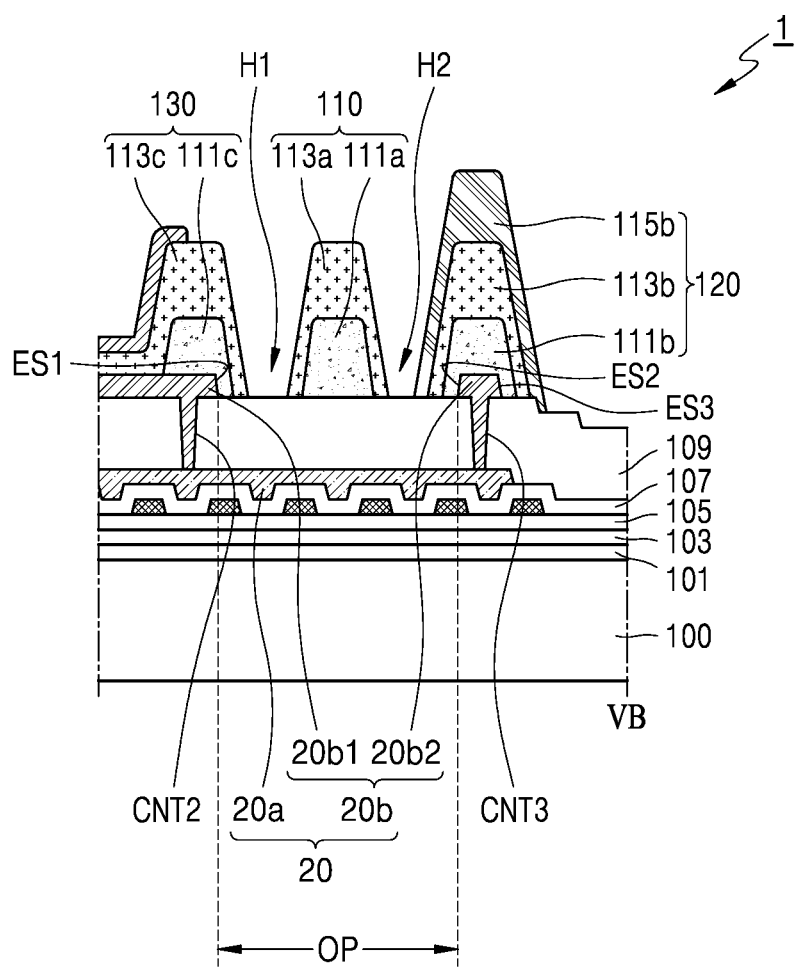
FIG. 6 is a schematic cross-sectional view of a region VI of FIG. 5, from which a thin-film encapsulation layer is omitted.
Figure 7:
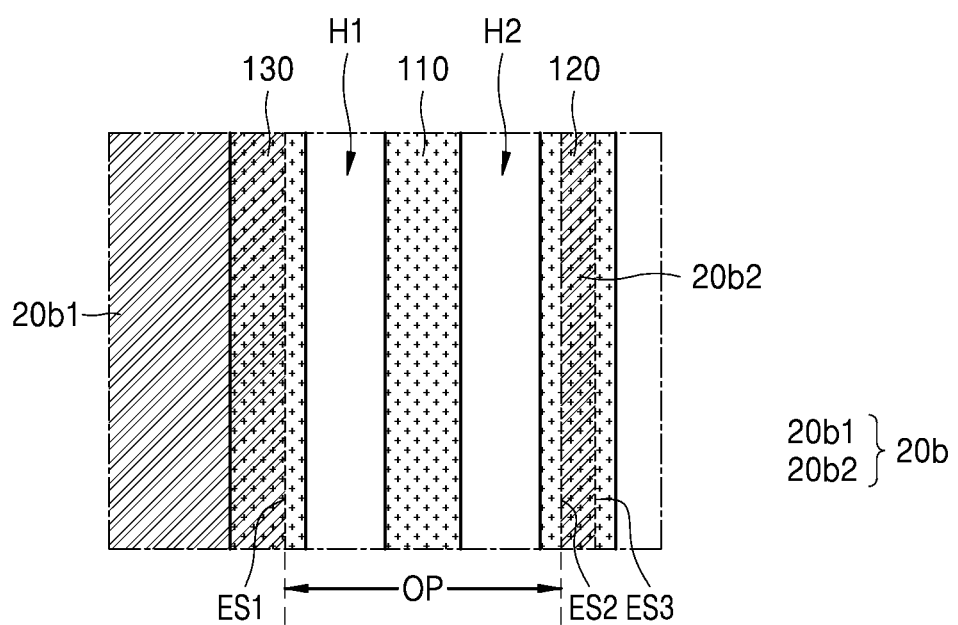
FIG. 7 is a plan view illustrating a fourth conductive layer and first to third dam portions of FIG. 6.

FIG. 6 is a schematic cross-sectional view of region VI of FIG. 5, from which the thin-film encapsulation layer 400 may be omitted, and FIG. 7 is a plan view illustrating the fourth conductive layer 20b and the first to third dam portions 110, 120, and 130 of FIG. 6.

Referring to FIGS. 6 and 7, the fourth conductive layer 20b of the second power supply voltage line 20 may be located or disposed on the first organic layer 109, and a single opening OP exposing an upper surface of the first organic layer 109 may be formed in the fourth conductive layer 20b. The opening OP may be described as a single opening in an embodiment. However, the disclosure is not limited thereto. For example, the opening OP may be an opening or a plurality of openings within the spirit and the scope of the disclosure.

The single opening OP may be formed between the third dam portion 130 and the second dam portion 120 in a direction in which the third dam portion 130 and the second dam portion 120 may extend. The first dam portion 110 located or disposed between the third dam portion 130 and the second dam portion 120 may be arranged or disposed at a position overlapping the single opening OP formed in the fourth conductive layer 20b. The opening OP may be described as a single opening in an embodiment. However, the disclosure is not limited thereto. For example, the opening OP may be an opening or a plurality of openings within the spirit and the scope of the disclosure.

The third dam portion 130 and the first dam portion 110 may be spaced apart from each other, and a first hole H1 may be formed between the third dam portion 130 and the first dam portion 110. The first dam portion 110 and the second dam portion 120 may be spaced apart from each other, and a second hole H2 may be formed between the first dam portion 110 and the second dam portion 120. The size of the opening OP formed between the third dam portion 130 and the second dam portion 120 may be greater than the sum of the sizes of the first hole H1 and the second hole H2. However, the disclosure is not limited thereto.

A part of the opening OP formed in the fourth conductive layer 20b may be covered with or overlapped by the first dam portion 110, but another part of the opening OP may be exposed in the first hole H1 and the second hole H2. Therefore, out-gas emitted from the first organic layer 109 during the process of forming the organic light-emitting diode OLED may be discharged to the outside through the first hole H1 and the second hole H2.

The third dam portion 130 may clad a first end ES1 of the first portion 20b1 of the fourth conductive layer 20b, and the second dam portion 120 may clad a second end ES2 and a third end ES3 of the second portion 20b2 of the fourth conductive layer 20b, thereby preventing the first to third ends ES1, ES2, and ES3 of the fourth conductive layer 20b from being damaged while etching patterns of the fourth conductive layer 20b.

The fourth conductive layer 20b may be formed of the same or similar material as that of the driving voltage line PL (see FIG. 5). In an embodiment, the fourth conductive layer 20b may be a single-layered film or a multi-layered film including at least one of aluminum (Al), copper (Cu), titanium (Ti), and any alloy thereof. For example, the fourth conductive layer 20b may have a stack structure of a first layer including titanium (Ti), a second layer including aluminum (Al), and a third layer including titanium (Ti).

Figure 8:
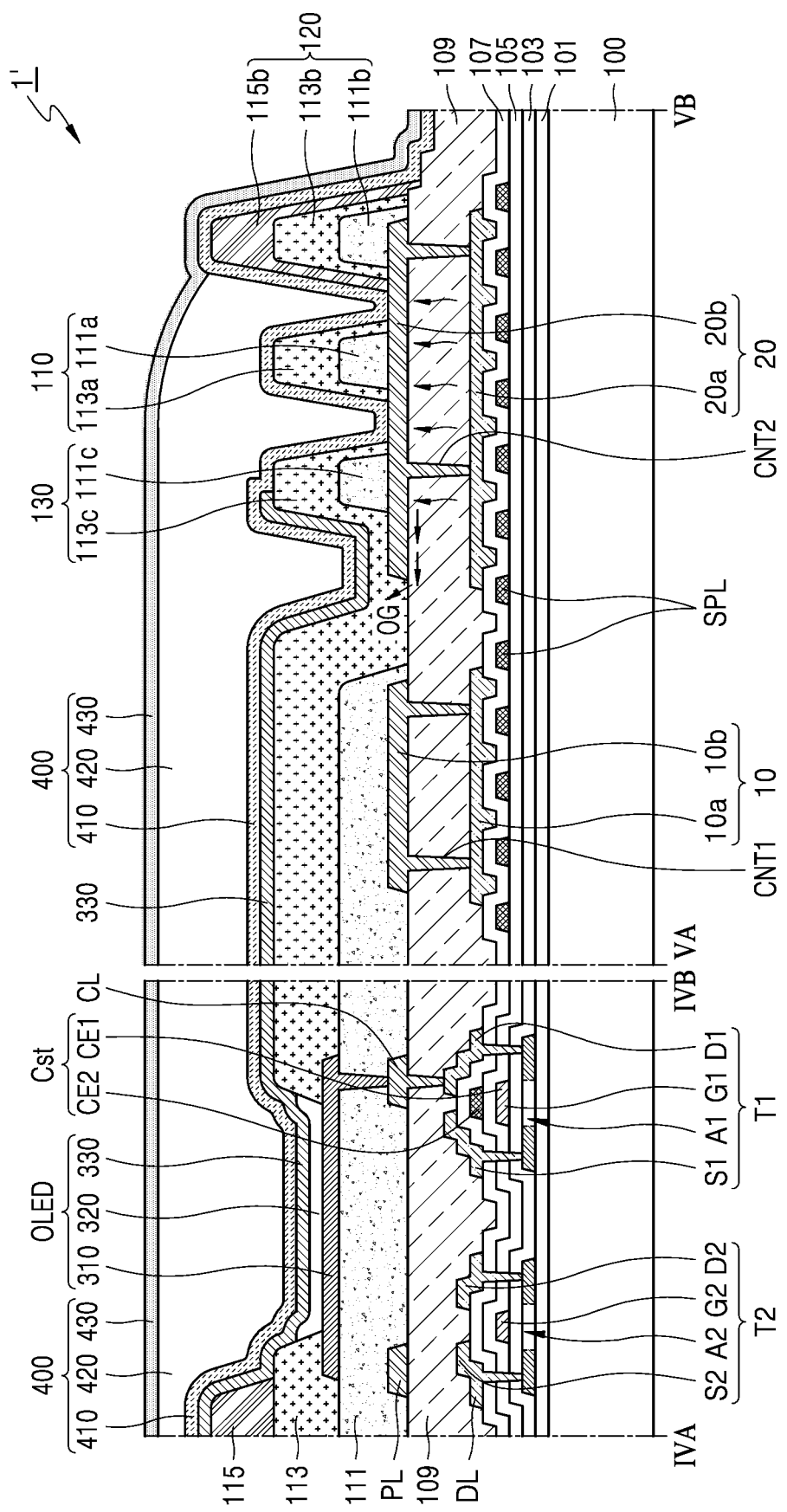
FIG. 8 is a schematic cross-sectional view of a display apparatus according to a comparative example.

FIG. 8 is a schematic cross-sectional view of a display apparatus 1' according to a comparative example. Main differences from the display apparatus 1 of FIG. 5, according to an embodiment, will be described.

The left side of FIG. 8 may be the same as the IVA-IVB region of FIG. 5, and the right side of FIG. 8 may be similar to the VA-VB region of FIG. 5 except for the structure of the fourth conductive layer.

Referring to the VA-VB region, a buffer layer 101, a first gate insulating layer 103, a second gate insulating layer 105, an interlayer insulating layer 107, and a first organic layer 109, which may extend in a display area DA, may be arranged or disposed on a substrate 100. Spider lines SPL may be arranged or disposed between the second gate insulating layer 105 and the interlayer insulating layer 107, a first conductive layer 10a and a third conductive layer 20a may be arranged or disposed on the interlayer insulating layer 107, and a second conductive layer 10b and a fourth conductive layer 20b may be arranged or disposed on the first organic layer 109.

The first conductive layer 10a and the second conductive layer 10b may be electrically connected through first contact holes CNT1 formed in the interlayer insulating layer 107 to constitute a first power supply voltage line 10. The third conductive layer 20a and the fourth conductive layer 20b may be electrically connected through second contact holes CNT2 formed in the interlayer insulating layer 107 to constitute a second power supply voltage line 20.

Different from an above-described embodiment of FIG. 5, the opening OP exposing an upper surface of the first organic layer 109 may not be formed in the fourth conductive layer 20b of the comparative example. Therefore, since the fourth conductive layer 20b may block the upper portion of the first organic layer 109, out-gas OG generated in the first organic layer 109 in the process of forming the organic light-emitting diode OLED may not be effectively discharged to the outside and remain in the organic light-emitting diode OLED, thus causing damage to the organic light-emitting diode OLED.

Figure 9:
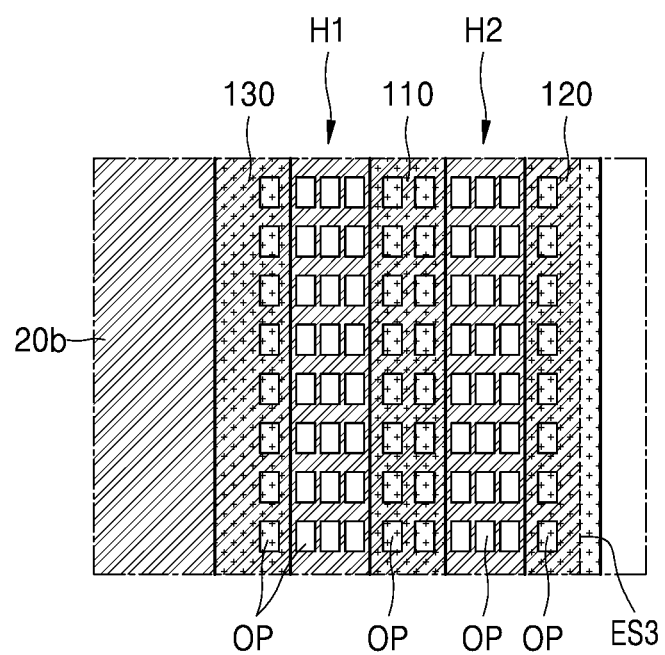
FIG. 9 is a schematic plan view of a display apparatus according to an embodiment.

FIG. 9 is a schematic plan view of a display apparatus according to an embodiment.

Referring to FIG. 9, openings OP exposing an upper surface of a first organic layer 109 may be formed in a fourth conductive layer 20b.

A third dam portion 130 and a first dam portion 110 may be spaced apart from each other, and a first hole H1 may be formed between the third dam portion 130 and the first dam portion 110. The first dam portion 110 and a second dam portion 120 may be spaced apart from each other, and a second hole H2 may be formed between the first dam portion 110 and the second dam portion 120. Some (or a predetermined amount of) openings OP formed between the third dam portion 130 and the second dam portion 120 may be arranged or disposed to overlap the first hole H1 and the second hole H2.

When comparing an embodiment of FIG. 7 with the comparative example, positions at which the openings OP may be formed may be arranged or disposed between the third dam portion 130 and the second dam portion 120 as in an embodiment of FIG. 7. However, different from the embodiment of FIG. 7, the number of openings OP may increase and the size of the openings OP may decrease.

Different from an above-described embodiment of FIG. 7, the fourth conductive layer 20b may not be divided into the first portion 20b1 (see FIG. 7) and the second portion 20b2 (see FIG. 7) and may be connected between the openings OP. In an embodiment, the out-gas may be effectively discharged by forming the openings OP in the fourth conductive layer 20b, and lower surfaces of the first to third dam portions 110, 120, and 130 may be in direct contact with an upper surface of the first organic layer 109 through the openings OP, thereby improving bonding strength between the first to third dam portions 110, 120, and 130 and the first organic layer 109.

The openings OP are illustrated in FIG. 9 as having substantially the same size, but this is merely an example. The size and shape of the openings OP may be variously modified.

The second dam portion 120 may clad a third end ES3 of the fourth conductive layer 20b, thereby preventing the third end ES3 of the fourth conductive layer 20b from being damaged while etching patterns of the fourth conductive layer 20b.

Figure 10:
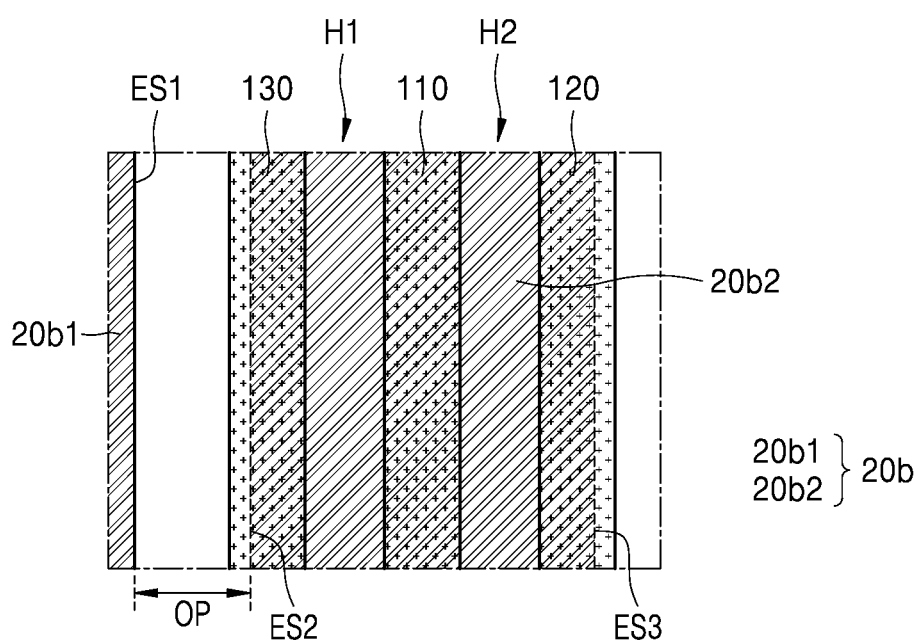
FIG. 10 is a schematic plan view of a display apparatus according to an embodiment.

FIG. 10 is a schematic plan view of a display apparatus according to an embodiment.

Referring to FIG. 10, a single opening OP exposing an upper surface of a first organic layer 109 may be formed in a fourth conductive layer 20b. The opening OP may be described as a single opening in an embodiment. However, the disclosure is not limited thereto. For example, the opening OP may be an opening or a plurality of openings within the spirit and the scope of the disclosure.

The single opening OP may be formed between the first power supply voltage line 10 (see FIG. 5) and a third dam portion 130 in a direction in which the first power supply voltage line 10 and the third dam portion 130 may extend. The opening OP may be described as a single opening in an embodiment. However, the disclosure is not limited thereto. For example, the opening OP may be an opening or a plurality of openings within the spirit and the scope of the disclosure.

The third dam portion 130 and a first dam portion 110 may be spaced apart from each other, and a first hole H1 may be formed between the third dam portion 130 and the first dam portion 110. The first dam portion 110 and a second dam portion 120 may be spaced apart from each other, and a second hole H2 may be formed between the first dam portion 110 and the second dam portion 120. In an embodiment, the opening OP may not overlap the first hole H1 and the second hole H2.

When comparing an embodiment of FIG. 7 with the comparative example, the number of openings OP may be one as in the embodiment of FIG. 7, but the opening OP may be formed between the first power supply voltage line 10 and the third dam portion 130 different from the embodiment of FIG. 7.

As in the above-described embodiment of FIG. 7, the fourth conductive layer 20b may include a first portion 20b1 and a second portion 20b2 that may be spaced apart from each other by the opening OP.

The third dam portion 130 may clad a second end ES2 of the second portion 20b2 of the fourth conductive layer 20b, and the second dam portion 120 may clad a third end ES3 of the second portion 20b2 of the fourth conductive layer 20b, thereby preventing the second end ES2 and the third end ES3 of the fourth conductive layer 20b from being damaged while etching patterns of the fourth conductive layer 20b.

Figure 11:
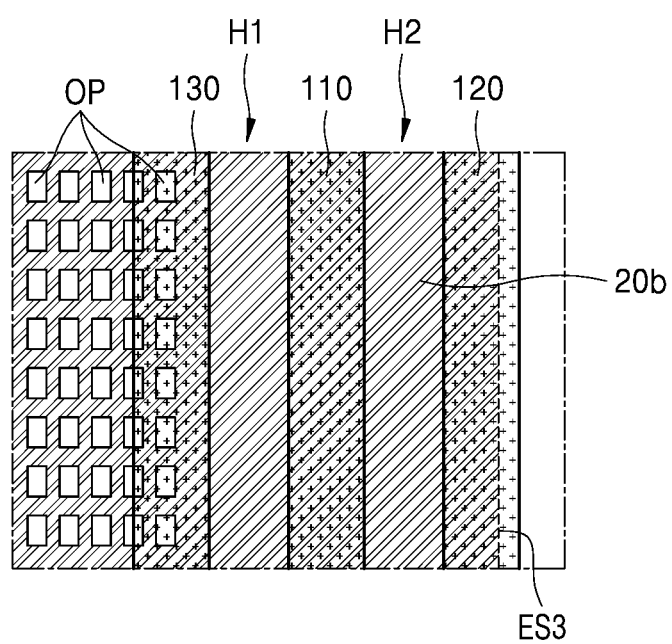
FIG. 11 is a schematic plan view of a display apparatus according to an embodiment.

FIG. 11 is a schematic plan view of a display apparatus according to an embodiment.

Referring to FIG. 11, openings OP exposing an upper surface of the first organic layer 109 (see FIG. 5) may be formed in a fourth conductive layer 20b between the first power supply voltage line 10 (see FIG. 5) and a third dam portion 130.

The third dam portion 130 and a first dam portion 110 may be spaced apart from each other, and a first hole H1 may be formed between the third dam portion 130 and the first dam portion 110. The first dam portion 110 and a second dam portion 120 may be spaced apart from each other, and a second hole H2 may be formed between the first dam portion 110 and the second dam portion 120. In an embodiment, the opening OP may not overlap the first hole H1 and the second hole H2.

When comparing the embodiment of FIG. 7 with the comparative example, positions at which the openings OP may be formed may be formed between the first power supply voltage line 10 and the third dam portion 130 as in an embodiment of FIG. 7, the number of openings OP may increase, and the size of the openings OP may decrease.

Different from an above-described embodiment of FIG. 7, the fourth conductive layer 20b may not be divided into the first portion 20b1 (see FIG. 7) and the second portion 20b2 (see FIG. 7) and may be connected between the openings OP. In an embodiment, the out-gas may be effectively discharged by forming the openings OP in the fourth conductive layer 20b, and a lower surface of the third dam portion 130 may be in direct contact with an upper surface of the first organic layer 109 through the openings OP, thereby improving bonding strength between the third dam portion 130 and the first organic layer 109.

The openings OP are illustrated in FIG. 11 as having substantially the same size, but this is merely an example. The size and shape of the openings OP may be variously modified.

The second dam portion 120 may clad a third end ES3 of the fourth conductive layer 20b, thereby preventing the third end ES3 of the fourth conductive layer 20b from being damaged while etching patterns of the fourth conductive layer 20b.

Figure 12:
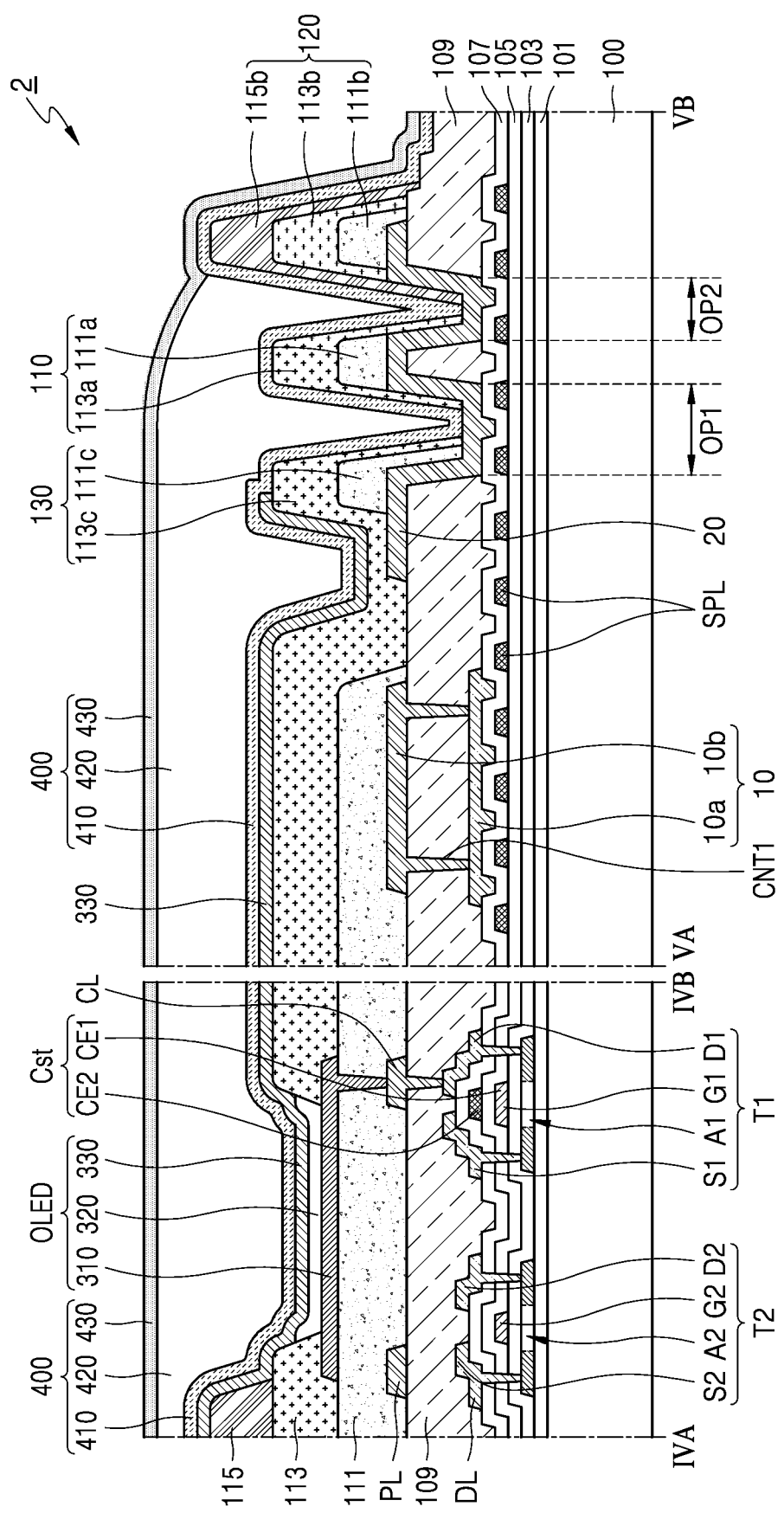
FIG. 12 is a schematic cross-sectional view of a display apparatus according to an embodiment.

FIG. 12 is a schematic cross-sectional view of a display apparatus 2 according to an embodiment.

The left side of FIG. 12 illustrates the structure of the pixel P of FIG. 4, and the right side of FIG. 5 illustrates a schematic cross-section taken along VA-VB of FIG. 1.

The buffer layer 101, the first gate insulating layer 103, the second gate insulating layer 105, the interlayer insulating layer 107, and the first organic layer, which may extend on the substrate 100 in the display area DA, may be arranged or disposed in the VA-VB region. Spider lines SPL may be arranged or disposed between the second gate insulating layer 105 and the interlayer insulating layer 107, a first conductive layer 10a and a portion of the second power supply voltage line 20 may be arranged or disposed on the interlayer insulating layer 107, and a second conductive layer 10b and other portions of the second power supply voltage line 20 may be arranged or disposed on the first organic layer 109.

The first conductive layer 10a and the second conductive layer 10b may be electrically connected through first contact holes CNT1 formed in the interlayer insulating layer 107 to constitute a first power supply voltage line 10. Since the first power supply voltage line 10 is formed as a two-layer conductive layer, a width of the first power supply voltage line 10 may be reduced, thereby reducing a dead space. Two first contact holes CNT1 are illustrated in FIG. 5, but this is an example. The number of first contact holes CNT1 may be one or three or more within the spirit and the scope of the disclosure.

In an embodiment, different from an embodiment of FIG. 5, a second power supply voltage line 20 may be a one-layer conductive layer instead of a two-layer conductive layer. In an area in which the second power supply voltage line 20 may be arranged or disposed, openings OP1 and OP2 may be formed in the first organic layer 109 to form a substantially concave-convex pattern. The second power supply voltage line 20 may be formed or disposed on the first organic layer 109 along the substantially concave-convex pattern.

Different from the first power supply voltage line 10, the second power supply voltage line 20 formed as the substantially concave-convex pattern instead of the two-layer conductive layer may have a wider effective line width, thereby reducing electrical resistance. The openings OP1 and OP2 may be formed to reduce the amount occupied by the first organic layer 109, thereby reducing the amount of out-gas emitted from the first organic layer 109.

The first conductive layer 10a may be formed of the same or similar material as that of a data line DL, and the second conductive layer 10b and the second power supply voltage line 20 may be formed of the same or similar material as that of a driving voltage line PL.

A second organic layer 111 and a pixel defining layer 113 may be respectively located or disposed on the second conductive layer 10b and the second organic layer 111 at a position overlapping the first power supply voltage line 10. An opposite electrode 330 formed or disposed in the display area DA may extend on the pixel defining layer 113. The opposite electrode 330 may extend to cover or overlap a part of the third dam portion 130.

A thin-film encapsulation layer 400 arranged or disposed on the opposite electrode 330 may cover or overlap the display area DA and extend to the outside of the display area DA. The thin-film encapsulation layer 400 may include at least one organic encapsulation layer and at least one inorganic encapsulation layer. The structure, material, and the like of the thin-film encapsulation layer 400 may be applied in a same or similar manner as in an embodiment of FIG. 5.

The third dam portion 130, the first dam portion 110, and the second dam portion 120 may be sequentially arranged or disposed at a position overlapping the second power supply voltage line 20 in a direction from the display area DA to the end of the substrate 100.

The third dam portion 130 may include a first layer 111c formed of the same or similar material as that of the second organic layer 111 and a second layer 113c may be formed of the same or similar material as that of the pixel defining layer 113.

The first dam portion 110 may include a first layer 111a formed of the same or similar material as that of the second organic layer 111 and a second layer 113a may be formed of the same or similar material as that of the pixel defining layer 113.

The second dam portion 120 may include a first layer 111b formed of the same or similar material as that of the second organic layer 111, a second layer 113b may be formed of the same or similar material as that of the pixel defining layer 113, and a third layer 115b may be formed of the same or similar material as that of the spacer 115.

In order to maintain appropriate heights of the first to third dam portions 110, 120, and 130, the first to third dam portions 110, 120, and 130 may be arranged or disposed in a convex region of the second power supply voltage line forming the substantially concave-convex pattern.

According to one or more embodiments, when the second power supply voltage line is formed as two conductive layers, the amount of exhaust gas, or out gas, emitted from the organic layer arranged or disposed between the two conductive layers may be reduced, thereby preventing defective pixels of the display apparatus from occurring due to the exhaust gas or the out gas. However, the scope of the disclosure is not limited by these effects.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A display apparatus comprising:
a substrate;
a display area comprising a plurality of pixels disposed on the substrate;
a non-display area adjacent to the display area;
a first power supply voltage line disposed in the non-display area and comprising:
a first conductive layer;
a first organic layer disposed on the first conductive layer; and
a second conductive layer disposed on the first organic layer;
a second power supply voltage line disposed in the non-display area and comprising:
a third conductive layer spaced apart from the first conductive layer; and
a fourth conductive layer disposed on the first organic layer, wherein the first organic layer is disposed on the third conductive layer;
a first dam portion surrounding the display area and disposed adjacent to the first power supply voltage line;
a second dam portion disposed adjacent to the first dam portion; and
a third dam portion disposed between the first power supply voltage line and the first dam portion,
wherein the fourth conductive layer includes an opening exposing an upper surface of the first organic layer between the first power supply voltage line and the second dam portion.

2. The display apparatus of claim 1, further comprising:
a second organic layer disposed on the first organic layer; and
a pixel defining layer disposed on the second organic layer, wherein the first dam portion comprises:
a first layer including a part of the second organic layer; and
a second layer including a part of the pixel defining layer,
the second dam portion comprises:
a first layer including a part of the second organic layer; and
a second layer including a part of the pixel defining layer, and
the third dam portion includes:
a first layer including a part of the second organic layer; and
a second layer including a part of the pixel defining layer.

3. The display apparatus of claim 2, wherein the fourth conductive layer comprises an opening disposed between the third dam portion and the second dam portion in an extending direction of the third dam portion and the second dam portion.

4. The display apparatus of claim 3, wherein the opening is disposed to overlap the first dam portion.

5. The display apparatus of claim 3, wherein
the fourth conductive layer comprises a first portion and a second portion spaced apart from each other by the opening,
the third dam portion overlaps an end of the first portion adjacent to the opening, and
the second dam portion overlaps an end of the second portion adjacent to the opening.

6. The display apparatus of claim 5, wherein the second dam portion overlaps an end of the second portion at a predetermined distance from the opening.

7. The display apparatus of claim 2, wherein the fourth conductive layer comprises a plurality of openings disposed between the third dam portion and the second dam portion.

8. The display apparatus of claim 2, wherein the fourth conductive layer comprises an opening disposed between the first power supply voltage line and the third dam portion in an extending direction of the third dam portion.

9. The display apparatus of claim 2, wherein the fourth conductive layer comprises a plurality of openings disposed between the first power supply voltage line and the third dam portion.

10. The display apparatus of claim 2, wherein
the pixel comprises:
a first electrode;
an emission layer disposed on the first electrode; and
a second electrode disposed on the emission layer,
the second electrode is commonly disposed in the plurality of pixels, and
the second electrode extends toward the non-display area to overlap a part of the third dam portion.

11. The display apparatus of claim 10, further comprising a spacer disposed on the pixel defining layer, wherein
the second dam portion comprises a third layer on the second layer including the part of the pixel defining layer, and the second dam portion and the spacer includes a same material.

12. The display apparatus of claim 11, wherein a height of the second dam portion is greater than a height of the first dam portion and a height of the third dam portion.

13. The display apparatus of claim 2, wherein the third dam portion, the first dam portion, and the second dam portion overlap the second power supply voltage line.

14. The display apparatus of claim 1, wherein
the first conductive layer and the third conductive layer includes a same material, and
the second conductive layer and the fourth conductive layer includes a same material.

15. The display apparatus of claim 1, further comprising a thin-film encapsulation layer comprising:
a first inorganic encapsulation layer overlapping the display area;
an organic encapsulation layer on the first inorganic encapsulation layer; and
a second inorganic encapsulation layer on the organic encapsulation layer,
wherein the thin-film encapsulation layer overlaps the third dam portion and the first dam portion.

16. The display apparatus of claim 15, wherein the first inorganic encapsulation layer and the second inorganic encapsulation layer are in direct contact with an edge of the second dam portion.

17. The display apparatus of claim 1, wherein the first conductive layer is electrically connected to the second conductive layer through a first contact hole disposed in the first organic layer.

18. The display apparatus of claim 1, wherein the third conductive layer is electrically connected to the fourth conductive layer through a second contact hole disposed in the first organic layer.

* * * * *